United States Patent
Zhang et al.

(10) Patent No.: US 11,022,498 B2
(45) Date of Patent: Jun. 1, 2021

(54) MEASUREMENT APPARATUS AND POWER CABLE ACCESSORY AND SYSTEM USING THE SAME AND ASSEMBLING METHOD THEREFOR

(71) Applicant: ABB Schweiz AG, Baden (CH)

(72) Inventors: Yibo Zhang, Beijing (CN); Jiansheng Chen, Beijing (CN); Jian He, Beijing (CN); Bo Qiao, Beijing (CN); Chun Li, Beijing (CN)

(73) Assignee: ABB Schweiz AG, Baden (CH)

( * ) Notice: Subject to any disclaimer, the term of this patent is extended or adjusted under 35 U.S.C. 154(b) by 231 days.

(21) Appl. No.: 16/453,116

(22) Filed: Jun. 26, 2019

(65) Prior Publication Data
US 2019/0316969 A1 Oct. 17, 2019

Related U.S. Application Data

(63) Continuation of application No. PCT/CN2017/080396, filed on Apr. 13, 2017.

(51) Int. Cl.
*G01K 1/024* (2021.01)
*G01K 1/143* (2021.01)
(Continued)

(52) U.S. Cl.
CPC .......... *G01K 1/024* (2013.01); *G06K 7/10366* (2013.01); *G06K 19/0717* (2013.01); *G06K 19/0723* (2013.01)

(58) Field of Classification Search
CPC .................................................... G01K 1/024
See application file for complete search history.

(56) References Cited

U.S. PATENT DOCUMENTS 7,595,719 B2 * 9/2009 Chen .................. B60R 25/1004
340/426.1
8,729,856 B2 * 5/2014 Nathan ............... H01R 13/6683
320/109

(Continued)

FOREIGN PATENT DOCUMENTS

CN 102175341 A 9/2011
CN 202454744 U 9/2012

(Continued)

OTHER PUBLICATIONS

State Intellectual Property Office of the P.R. China, International Search Report & Written Opinion issued in corresponding Application No. PCT/CN2017/080396, dated Jan. 15, 2018, 11 pp.

*Primary Examiner* — Joseph H Feild
*Assistant Examiner* — Pameshanand Mahase
(74) *Attorney, Agent, or Firm* — Taft Stettinius & Hollister LLP

(57) ABSTRACT

An apparatus for measuring variable in relation to a power cable accessory, including: an RFID tag, including: a sensor configured to generate a signal indicative of the variable in its environment, an antenna, and an RFID IC electrically connected to the sensor and configured to process and modulate the signal generated by the sensor and transmit the modulated signal to an RFID reader via the antenna, wherein: the RFID tag is shaped to be fitted with the power cable accessory with its sensor in thermal contact with an electrical connector of the power cable accessory and with its antenna external to the electrical connector.

20 Claims, 3 Drawing Sheets

(51) Int. Cl.
  *G01R 31/66*   (2020.01)
  *G06K 7/10*    (2006.01)
  *G06K 19/07*   (2006.01)

(56)            References Cited

U.S. PATENT DOCUMENTS

| | | | |
|---|---|---|---|
| 9,304,047 B2 | 4/2016 | Huang et al. | |
| 2013/0307528 A1* | 11/2013 | King, Jr. | H01R 4/22 |
| | | | 324/157 |
| 2014/0191718 A1* | 7/2014 | Reineccius | B60L 53/665 |
| | | | 320/108 |
| 2017/0036219 A1* | 2/2017 | Peasley | G06K 7/10366 |

FOREIGN PATENT DOCUMENTS

| | | |
|---|---|---|
| CN | 204088784 U | 1/2015 |
| CN | 204651520 U | 9/2015 |
| CN | 104977097 A | 10/2015 |
| CN | 106197707 A | 12/2016 |
| CN | 106207940 A | 12/2016 |
| WO | 2016073413 A1 | 5/2016 |

* cited by examiner

MEASUREMENT APPARATUS AND POWER CABLE ACCESSORY AND SYSTEM USING THE SAME AND ASSEMBLING METHOD THEREFOR

TECHNICAL FIELD

The invention relates to measuring variable in relation to a power cable accessory, and more particularly to measurement of the variable by use of RFID (radio-frequency identification) system in combination with a sensor.

BACKGROUND ART

In medium/high voltage power distribution systems, power cable accessories are used for connecting at least two medium-voltage/high-voltage conductors with one another. Power cable accessory is also referred as power cable joint, power cable connector, power cable termination, power cable head or insulating plug.

Some variable in relation to the power cable accessory may cause failure of the power cable accessory on site. For example, the temperature of conductors of power cables may increase as currents carried by the power cables increase, and the conductor of the power cable accessory connecting the power cables normally will overheat in the first place and a fault may firstly happen at this weak point. Thus, measuring the variable in relation to the power cable accessory becomes necessary.

Sensor is known for use in measuring a variable in its environment in which it is located including, but not limited to, temperature, pressure, vibration, current, or magnetic field. Examples of resonant sensors include tuned circuits (electrical resonators) and quartz crystals (acousto-electrical resonators). The sensor may be configured such that at least one of its properties may be influenced by the variable of interest in the environment. In the example of a resonant sensor, the resonant frequency of the sensor is affected by the variable of interest. Accordingly, the resonant frequency of the sensor is indicative of the magnitude or presence of the variable of interest and a change in the magnitude of such variable is reflected in a change in the resonant frequency of the sensor.

RFID system integrated with a sensor for measuring power cable accessory's temperature has developed recently. For example, Patent CN 106207940 A discloses a cable accessory that has an RFID tag operating as temperature sensor is fitted into a groove of the connector (made of conductive materials) of the cable accessory and sending temperature signal to an RFID reader arranged external to the cable accessory. One possible disadvantage of the solution according to the patent is the reduction of the RF (radio frequency) field generated by the antenna of the RFID tag in the space due to electromagnetic shielding influence of the connector housing the antenna of the RFID tag.

BRIEF SUMMARY OF THE INVENTION

According to an aspect of present invention, it provides an apparatus for measuring variable in relation to a power cable accessory, including an RFID tag. The RFID tag includes a sensor configured to generate a signal indicative of the variable in its environment, an antenna and an RFID IC electrically connected to the sensor and configured to process and modulate the signal generated by the sensor and transmit the modulated signal to an RFID reader via the antenna. Wherein, the RFID tag is shaped to be fitted with the power cable accessory with its sensor in thermal contact with an electrical connector of the power cable accessory and with its antenna external to the electrical connector.

According to another aspect of present invention, it provides a power cable accessory, including: an electrical connector and an RFID tag. The RFID tag includes: a sensor configured to generate a signal indicative of the variable in its environment, an antenna and an RFID IC electrically connected to the sensor and configured to process and modulate the signal generated by the sensor and transmit the modulated signal to an RFID reader via the antenna. Wherein, the RFID tag is fitted with the power cable accessory with its sensor in thermal contact with an electrical connector of the power cable accessory and with its antenna external to the electrical connector.

By having the antenna arranged outside of the electrical connecter, the reduction of RF field from the influence of the shielding from the electrical connecter may be ameliorated, and the coupling of RF signals between the RFID tag and an RFID reader becomes relatively strong. Due to the positioning of the antenna, the space in which the RF signals are blocked as a result of the RF shielding influence from the electrical connector decreases in the dimension. This allows larger room for positioning of the RFID reader with effective RF coupling with the RFID tag. The arrangement of placing the RFID reader in within the RF field becomes more flexible.

Preferably, a first end of the RFID tag is shaped to be fitted into a first groove of the electrical connector of the power cable accessory. When assembling the power cable accessory, the first end of the RFID tag is fitted into the first groove of the electrical connector, allowing the sensor embedded therein being in thermal contact with the electrical connector and the antenna being external to the first groove of the electrical connecter.

Preferably, a second end of the RFID tag is shaped to be fitted into a second groove of an assembly of a semi-conductive layer and an insulation layer of the power cable accessory; and the antenna of the RFID is arranged external to the semi-conductive layer. Because only a part of the RFID tag is held in the first groove leaving the other part sticking out of it, it is relatively easy for the RFID tag to reciprocate through the opening of the first groove By fitting the second end of the RFID tag into the second groove of the assembly of the semi-conductive layer and the insulation layer, both of the ends of the RFID tag are respectively secured to the electrical connecter and the semi-conductive layer, consequently the tendency for relative movement between the RFID tag and the electrical connector is suppressed.

Preferably, the RFID IC is solely powered by a power received by the antenna from the RFID reader.

Preferably, the sensor and the antenna are mechanically fixed to opposite sides of the RFID IC.

According to another aspect of present invention, it provides a system, including: the apparatus for measuring variable in relation to a power cable accessory, the RFID reader; and a processor electrically connected to the RFID reader, being configured to monitor the variable in relation to the power cable accessory using an output of the RFID reader.

According to another aspect of present invention, it provides a system, including: the power cable accessory, the RFID reader and a processor electrically connected to the RFID reader, being configured to monitor the variable in relation to the power cable accessory using an output of the RFID reader.

According to another aspect of present invention, it provides a method for assembling a power cable accessory, including: fitting a first end of an RFID tag embedded with a sensor into a first groove of an electrical connector of the power cable accessory to have the sensor in thermal contact with the electrical connector; and fitting a second end of the RFID tag embedded with an antenna into a second groove of an assembly of the semi-conductive layer and an insulation layer of the power cable accessory to have the antenna external to the electrical connector.

According to another aspect of present invention, it provides a method for manufacturing a power cable accessory, including: forming an assembly of the semi-conductive layer and an insulation layer of the power cable accessory surrounding a second end of the RFID tag embedded with an antenna so that the second end of the RFID tag is fitted into a second groove of the assembly of the semi-conductive layer and the insulation layer; and enclosing an electrical connector of the power cable accessory in the assembly of the semi-conductive layer and the insulation layer with a first end of the RFID tag embedded with a sensor in thermal contact with the electrical connector.

BRIEF DESCRIPTION OF THE DRAWINGS

The subject matter of the invention will be explained in more detail in the following text with reference to preferred exemplary embodiments which are illustrated in the drawings, in which.

The reference symbols used in the drawings, and their meanings, are listed in summary form in the list of reference symbols. In principle, identical parts are provided with the same reference symbols in the figures.

PREFERRED EMBODIMENTS OF THE INVENTION

Figure 1:
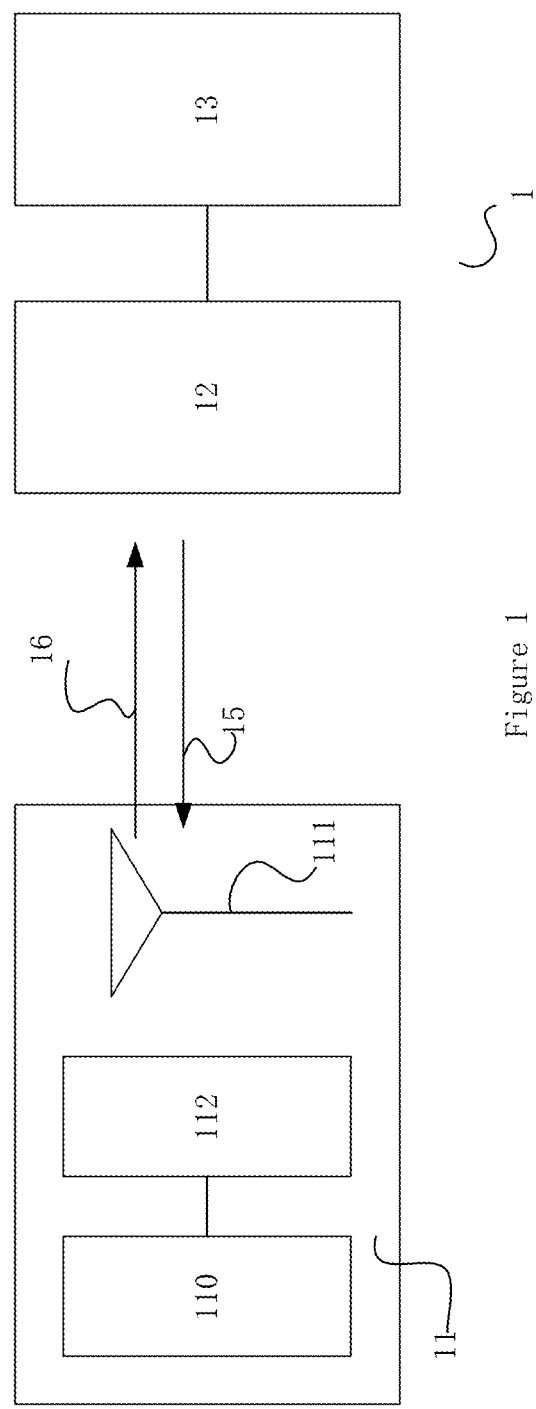
FIG. 1 is a schematic diagram of a system for monitoring a variable in relation to a power cable accessory according to an embodiment of present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

FIG. 1 is a schematic diagram of a system for monitoring a variable in relation to a power cable accessory according to an embodiment of present invention. The system 1 includes an RFID tag 11, an RFID reader 12, and a processor 13.

The RFID tag 11 includes a sensor 110, an antenna 111 and an RFID IC (RFID integrated circuit) 112 electrically connected to the sensor 110. The sensor 110 may generate a signal indicative of the variable in its environment. For example, the sensor 110 may use a temperature sensitive capacitor has a characteristic parameter that varies with temperature and is configured to be in thermal contact with the electrical connector of the power cable accessory. The RFID IC 112 may process and modulate the signal generated by the sensor 110 and transmit the modulated signal to an RFID reader 12 via the antenna 111. For example, the RFID IC 112 may perform frequency modulation of the processed signal that varies with the characteristic parameter of the sensor 110 which in turn varies with temperature of the electrical connector. The antenna 111 may be tuned to be working in a RF bandwidth of any range within 800 MHz to 1000 MHz and comply with international standards of UHF bandwidth regulation. The processor 13 may be electrically connected to the RFID reader 12 and monitor the variable in relation to the power cable accessory using an output of the RFID reader 12. For example, the processor 13 may communicate with the RFID reader 12 to ascertain the signal represented by the RF signal received by the RFID reader 12, and to determine a value of the temperature of the electrical connector based on the ascertained signal.

During operation, if there is a need to monitor the temperature of the electrical connector, the processor 13 may send out an instruction signal to the RFID reader 12. Once the RFID reader 12 receives the instruction signal, it may generate an RF field and generate and receive RF signals. In FIG. 1, a signal generated by the RFID reader 12 (which may be a UHF signal) is identified as 15, while a signal received by or transmitted to the RFID reader 12 (which may be a UHF signal) is identified as 16. The signal 16 generated by the RFID reader 12 may be received by the antenna 111 of the RF tag 11, if the antenna 111 is positioned within the RF field. The RFID tag 11 can be either passive, active or battery-assisted passive. A passive RFID tag is cheaper and smaller because it has no battery; instead, it uses the RF signal transmitted by the RFID reader. The RF signal 16 can induce the RFID tag 11 to oscillate, so that the RFID IC 112 of the RF tag 11 is solely powered by a power received by the antenna 111 from the RFID reader 12. The antenna 111 is configured to send a return signal 16 to the RFID reader 12 after the initial signal 15 has been processed or modified by the RFID IC 112. The antenna 111 may be variously configured, for example to be tuned to be working in a bandwidth of any range within 800 MHz to 1000 MHz and comply with international standards of UHF bandwidth regulation.

The system 1 may be broadened to include the power cable accessory.

Figure 2:
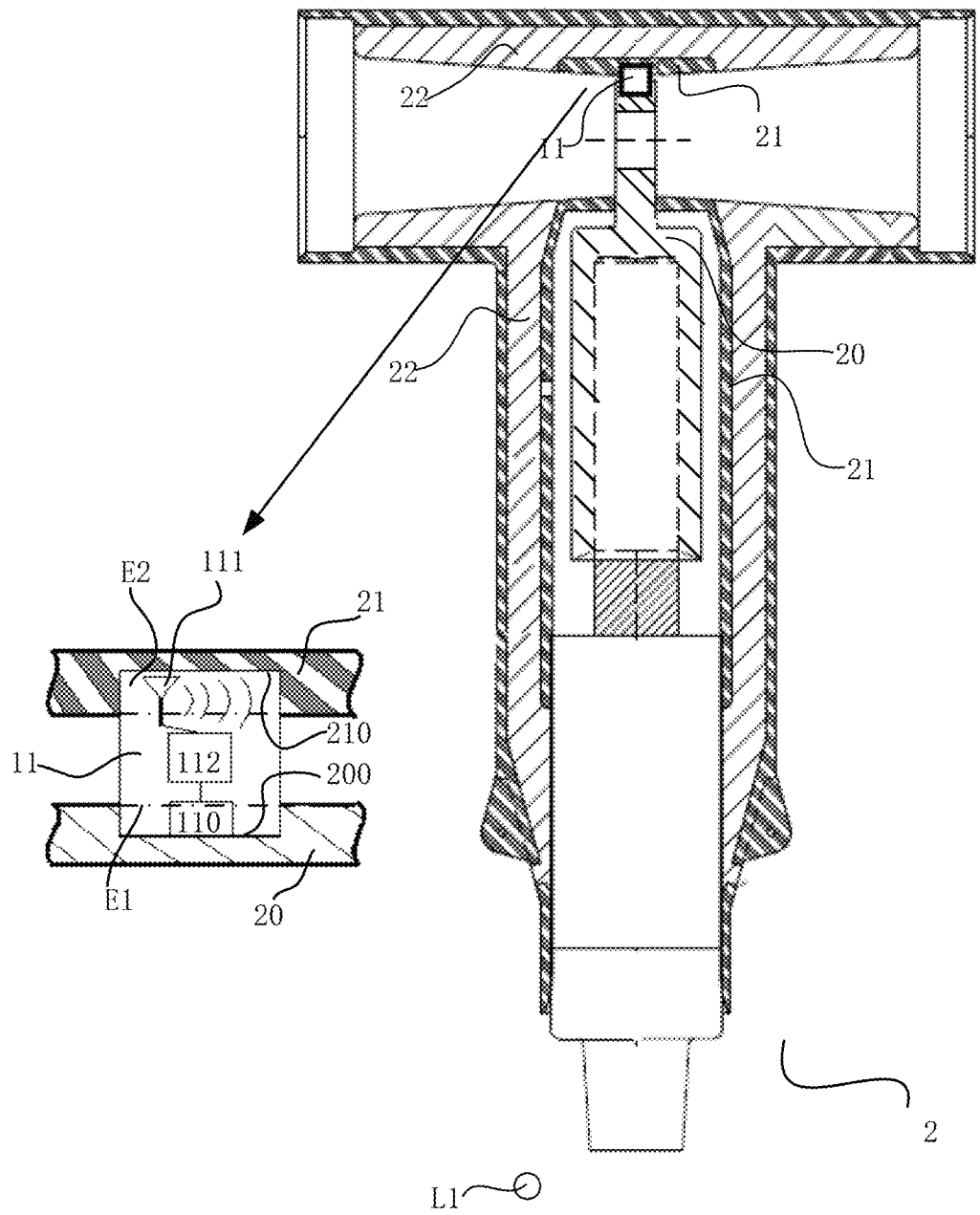
FIG. 2 is a sectional view of the power cable accessory according to an embodiment of present invention.

FIG. 2 is a sectional view of the power cable accessory according to an embodiment of present invention. As shown in FIG. 2, the power cable accessory 2 includes an electrical connector 20, a semi-conductive layer 21, an insulation layer 22 and an RFID tag 11. The semi-conductive layer 21 and the insulation layer 22 are overlapping with each other and an assembly thereof may enclose the electrical connector 20. The insulation layer 22 serves as an outer layer to the semi-conductive layer 21.

The RFID tag 11 is shaped to be fitted with the power cable accessory 2 with its sensor 110 in thermal contact with the electrical connector 20 of the power cable accessory 2 and with its antenna 111 external to the electrical connector 20. For example in this embodiment, the electrical connector 20 may have a first groove 200 which may be located at a specific portion of the electrical connector 20 inside the assembly of the semi-conductive layer 21 and the insulation layer 22. The first groove 200 may be disposed adjacent to a connection portion 200 of the electrical connector 20 and enclosed by the assembly of the semi-conductive layer 21 and the insulation layer 22. The connection portion 200 may be shaped like a hole to allow an insertion of a conductor being electrically coupled therewith. The assembly of the semi-conductive layer 21 and the insulation layer 22 may overlap with the first groove 200 to leave a space accommodating the RFID tag 11.

RF shielding can reduce the coupling of RF signals, thus a conductive enclosure may block RF field. In particular to a power cable accessory 2, it includes RF shielding at least in the form of the first groove 200 of the electrical connector 20. Supposing that the first groove 200 were to receive the whole part of the RFID tag 11, the shielding would impede the escape of RF signal from the antenna 111 of the RFID tag 11, and also prevent RF signals from being added to the antenna 111, and the amount of reduction depends very much upon the size, shape and orientation of openings in the shield to an incident RF field. For example, if the RFID reader 12 were to be positioned to the opposite side of the RFID tag 11 with respect to the first groove 200 at location L1, the RF signal propagating between the RFID tag 11 and the RFID reader 12 would reduce heavily so that securely RF communication would be lost. This is even worse for a passive RFID tag due to less power transmitted by the RF signal, which may cause cease of operation.

As shown in FIG. 2, a first end E1 of the RFID tag 11 is shaped to be fitted into the first groove 200 of the electrical connector 20, where the sensor 110 may be in thermal contact with the electrical connector 20 and where the antenna 111 may be external to the first groove 200 of the electrical connecter 20. The RFID tag 11 includes the sensor 110, the antenna 111 and the RFID IC 112. As an example, the sensor 110 and the antenna 111 are mechanically fixed to opposite sides of the RFID IC 112 within the RFID tag 11, and the sensor 110 may be disposed within the first end E1 of the RFID tag 11 while the antenna 111 may be disposed away from it in the RFID 11. The first groove 200 is adapted to accommodate the first end E1 of the RFID tag 11 to have the first end E1 of the RFID tag 11 fixed with the first groove 200 of the electrical connector 20 in a way that the sensor 110 may be in thermal contract or direct contact with the outer surface of the electrical connector 20 and the antenna 111 may be exposed in a sphere outside of the first groove 200 of the electrical connecter 20.

The fitting of the first end E1 of the RFID tag 11 and the first groove 200 of the electrical connecter 20, for example, may be secured by tight fitting, thermal conductive glue, thermal conductive layer, or a combination thereof. When assembling the power cable accessory, the first end E1 of the RFID tag 11 is fitted into the first groove 200 of the electrical connector 20, allowing the sensor 110 embedded therein being in thermal contact with the electrical connector 20 and the antenna 111 being external to the first groove 200 of the electrical connecter 20. By having the antenna 111 arranged outside of the first groove 200 of the electrical connecter 20, the reduction of RF field from the influence of the shielding from the electrical connecter 20 may be ameliorated, and the coupling of RF signals between the RFID tag 11 and the RFID reader 12 becomes relatively strong. Due to the positioning of the antenna 111, the space in which the RF signals are blocked as a result of the RF shielding influence from the electrical connector 20 decreases in the dimension. This allows larger room for positioning of the RFID reader 12 with effective RF coupling with the RFID tag 11. The arrangement of placing the RFID reader 12 in within the RF field becomes more flexible. For example, the RFID reader 12 even may be positioned to the other side of the opening of the first groove 200 at location L1. In some embodiments, the RFID reader 12 can be located outside the power cable accessory and configured to be electromagnetically coupled with the RFID tag 11.

Because only a part of the RFID tag 11 is held in the first groove 200 leaving the other part sticking out of it, it is relatively easy for the RFID tag 11 to reciprocate through the opening of the first groove 200. As shown in FIG. 2, the assembly of the semi-conductive layer 21 and the insulation layer 22 may have a second groove 210. The second groove 210 may be cut into the inner semi-conductive layer 21 only as shown in FIG. 2, or as an alternative into the insulation layer 22 through a passage of the semi-conductive layer 21. The first groove 200 and the second groove 210 may face with each other defining a closed or half-closed space having a profile accommodating the RFID tag 11. A second end E2 of the RFID tag 11 is shaped to be fitted into the second groove 210 of the semi-conductive layer 21. The sensor 110 embedded in the RFID tag 11 is positioned adjacent to the first end E1 of the RFID tag 11, and the antenna 111 embedded in the RFID tag 11 is arranged adjacent to the second E2 of the RFID tag 11. By fitting the second end E2 of the RFID tag 11 into the second groove 210 of the assembly of the semi-conductive layer 21 and the insulation layer 22, both of the ends of the RFID tag 11 are respectively secured to the electrical connecter 20 and the semi-conductive layer 21, consequently the tendency for relative movement between the RFID tag 11 and the electrical connector 20 is suppressed. For example, the fitting of the second end E2 of the RFID tag 11 and the second groove 210 is secured by tight fitting, glue, or a combination thereof. Therefore, air finds no place between the RFID tag and the semi-conductive layer. Consequently, partial discharge may be prevented.

A method for method for assembling the power cable accessory 2 includes: fitting the first end E1 of the RFID tag 11 embedded with the sensor 110 into the first groove 200 of the electrical connector 20 of the power cable accessory 2 to have the sensor 110 in thermal contact with the electrical connector 20, and fitting the second end E2 of the RFID tag 11 embedded with the antenna 111 into the second groove 210 of the assembly of the semi-conductive layer 21 and an insulation layer 22 of the power cable accessory 2 to have the antenna 111 external to the electrical connector 20. The order of the steps may be reversed.

Figure 3:
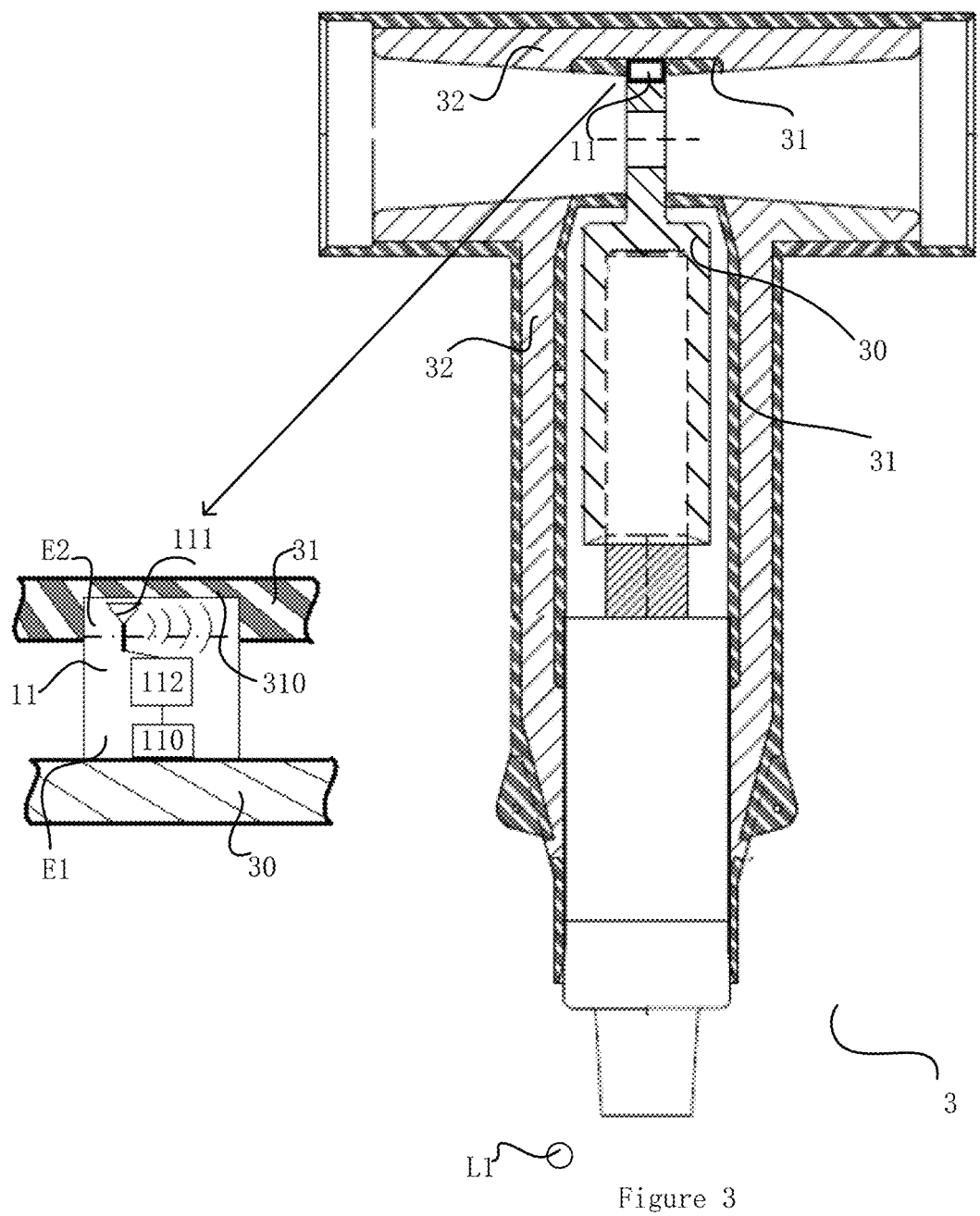
FIG. 3 is a sectional view of the power cable accessory according to another embodiment of present invention.

FIG. 3 is a sectional view of the power cable accessory according to another embodiment of present invention. As shown in FIG. 3, the power cable accessory 3 includes an electrical connector 30, a semi-conductive layer 31, an insulation layer 32 and an RFID tag 11. The semi-conductive layer 31 and the insulation layer 32 are overlapping with each other and an assembly thereof may enclose the electrical connector 30. The insulation layer 32 serves as an outer layer to the semi-conductive layer 31.

The RFID tag 11 is shaped to be fitted with the power cable accessory 3 with its sensor 110 in thermal contact with the electrical connector 30 of the power cable accessory 3 and with its antenna 111 external to the electrical connector 30. For example in this embodiment, the RFID tag 11 may have a first end E1 and a second end E2, and the sensor 110 may be disposed within the first end E1 of the RFID tag 11 while the antenna 111 may be disposed away from it in the RFID 11. The antenna 111 may be embedded in to adjacent to the second end E2 of the RFID 11. A second groove 310 may be formed into the assembly of the inner semi-conductive layer 31 only as shown in FIG. 3, or as an alternative into the insulation layer 32 through a passage of the semi-conductive layer 31. The second end E2 of the RFID tag 11 is shaped to be fitted into the second groove 310 of the semi-conductive layer 31, for example by tight-fitting or glue. Air finds no place between the RFID tag and the semi-conductive layer. Consequently, partial discharge may be prevented. As an alternative, the second end E2 may be secured to the semi-conductive layer 31 in the process of manufacturing the power cable accessory 3. For example, when forming the semi-conductive layer 31, the semi-conductive material may be poured into the mould to fill in an area around the second end E2 of the RFID tag 11. The process of forming moulding is helpful for shortening the manufacture cycle. The first end E1 of the RFID tag 11, embedded with the sensor 110, may thus exposes external to the semi-conductive layer 31 and extends to the electrical connector 30 so as to be in thermal contract or direct contact with the outer surface of the electrical connector 30.

A method for manufacturing the power cable accessory 3 includes: forming the assembly of the semi-conductive layer 31 and an insulation layer 32 of the power cable accessory 3 surrounding the second end E2 of the RFID tag 11 embedded with the antenna 111 so that the second end E2 of the RFID tag 11 is fitted into the second groove 310 of the assembly of the semi-conductive layer 31 and the insulation layer 32; and enclosing the electrical connector 30 of the power cable accessory 3 in the assembly of the semi-conductive layer 31 and the insulation layer 32 with the first end E1 of the RFID tag 11 embedded with the sensor 110 in thermal contact with the electrical connector 30.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:
1. An apparatus for measuring variable in relation to a power cable accessory, including:
an RFID tag, including:
a sensor configured to generate a signal indicative of the variable in its environment;
an antenna; and
an RFID IC electrically connected to the sensor and configured to process and modulate the signal generated by the sensor and transmit the modulated signal to an RFID reader via the antenna;
wherein:
the RFID tag is shaped to be fitted with the power cable accessory with its sensor in thermal contact with an electrical connector of the power cable accessory and with its antenna external to the electrical connector.
2. The apparatus according to claim 1, wherein:
a first end of the RFID tag is shaped to be fitted into a first groove of the electrical connector of the power cable accessory.

3. The apparatus according to claim 2, wherein:
the fitting of the first end of the RFID tag and the first groove of the electrical connector is secured by tight fitting, thermal conductive glue, thermal conductive layer, or a combination thereof.
4. The apparatus according to claim 1, wherein:
a second end of the RFID tag is shaped to be fitted into a second groove of an assembly of a semi-conductive layer and an insulation layer of the power cable accessory; and
the antenna of the RFID is arranged external to the semi-conductive layer.
5. The apparatus according to claim 4, wherein:
the fitting of the second end of the RFID tag and the second groove of the assembly of the semi-conductive layer and the insulation layer is secured by tight fitting, glue, or a combination thereof.
6. The apparatus according to claim 1, wherein:
the RFID IC is solely powered by a power received by the antenna from the RFID reader.
7. The apparatus according to claim 1, wherein:
the sensor and the antenna are mechanically fixed to opposite sides of the RFID IC.
8. The apparatus according to claim 1, wherein:
the sensor is further configured to sense the variable of temperature.
9. A power cable accessory, including:
an electrical connector; and
an RFID tag, including:
a sensor configured to generate a signal indicative of the variable in its environment;
an antenna; and
an RFID IC electrically connected to the sensor and configured to process and modulate the signal generated by the sensor and transmit the modulated signal to an RFID reader via the antenna;
wherein:
the RFID tag is fitted with the power cable accessory with its sensor in thermal contact with an electrical connector of the power cable accessory and with its antenna external to the electrical connector.
10. The power cable accessory according to claim 9, wherein:
a first end of the RFID tag is fitted into a first groove of the electrical connector of the power cable accessory.
11. The power cable accessory according to claim 10, wherein:
the fitting of the first end of the RFID tag and the first groove of the electrical connector is secured by tight fitting, thermal conductive glue or thermal conductive layer.
12. The power cable accessory according to claim 9, wherein:
a second end of the RFID tag is fitted into a second groove of an assembly of a semi-conductive layer and an insulation layer of the power cable accessory; and
the antenna of the RFID is arranged external to the semi-conductive layer.
13. The power cable accessory according to claim 12, wherein:
the fitting of the second end of the RFID tag and the second groove of the assembly of the semi-conductive layer and the insulation layer is secured by tight fitting or glue.
14. The power cable accessory according to claim 9, wherein:
the RFID IC is solely powered by a power received by the antenna from the RFID reader.

15. The power cable accessory according to claim 9, wherein:
the sensor and the antenna are mechanically fixed to opposite sides of the RFID IC.

16. The power cable accessory according to claim 9, wherein:
the sensor is further configured to sense the variable of temperature.

17. A system, including:
an apparatus for measuring variable in relation to a power cable accessory, including:
an RFID tag, including:
a sensor configured to generate a signal indicative of the variable in its environment;
an antenna; and
an RFID IC electrically connected to the sensor and configured to process and modulate the signal generated by the sensor and transmit the modulated signal to an RFID reader via the antenna;
wherein the RFID tag is shaped to be fitted with the power cable accessory with its sensor in thermal contact with an electrical connector of the power cable accessory and with its antenna external to the electrical connect on; and
a processor electrically connected to the RFID reader, being configured to monitor the variable in relation to the power cable accessory using an output of the RFID reader.

18. A system, including:
an electrical connector; and
an RFID tag, including:
a sensor configured to generate a signal indicative of the variable in its environment;
an antenna; and
an RFID IC electrically connected to the sensor and configured to process and modulate the signal generated by the sensor and transmit the modulated signal to an RFID reader via the antenna;
wherein the RFID tag is fitted with the power cable accessory with its sensor in thermal contact with an electrical connector of the power cable accessory and with its antenna external to the electrical connector; and
a processor electrically connected to the RFID reader, being configured to monitor the variable in relation to the power cable accessory using an output of the RFID reader.

19. A method for assembling a power cable accessory, including:
fitting a first end of an RFID tag embedded with a sensor into a first groove of an electrical connector of the power cable accessory to have the sensor in thermal contact with the electrical connector; and
fitting a second end of the RFID tag embedded with an antenna into a second groove of an assembly of the semi-conductive layer and an insulation layer of the power cable accessory to have the antenna external to the electrical connector.

20. A method for manufacturing a power cable accessory, including:
forming an assembly of the semi-conductive layer and an insulation layer of the power cable accessory surrounding a second end of the RFID tag embedded with an antenna so that the second end of the RFID tag is fitted into a second groove of the assembly of the semi-conductive layer and the insulation layer; and
enclosing an electrical connector of the power cable accessory in the assembly of the semi-conductive layer and the insulation layer with a first end of the RFID tag embedded with a sensor in thermal contact with the electrical connector.

* * * * *